United States Patent
Yamaguchi

(10) Patent No.: US 11,634,580 B2
(45) Date of Patent: Apr. 25, 2023

(54) CURABLE WHITE SILICONE FORMULATION, A REFLECTIVE MATERIAL FOR OPTICAL SEMICONDUCTOR MODULE, AND OPTICAL SEMICONDUCTOR DEVICE

(71) Applicant: DuPont Toray Specialty Materials Kabushiki Kaisha, Tokyo (JP)

(72) Inventor: Sosuke Yamaguchi, Chiba (JP)

(73) Assignee: DuPont Toray Specialty Materials Kabushiki Kaisha, Tokyo (JP)

( * ) Notice: Subject to any disclaimer, the term of this patent is extended or adjusted under 35 U.S.C. 154(b) by 52 days.

(21) Appl. No.: 17/129,181

(22) Filed: Dec. 21, 2020

(65) Prior Publication Data

US 2021/0198490 A1  Jul. 1, 2021

(30) Foreign Application Priority Data

Dec. 25, 2019  (JP) .............. JP2019-235110

(51) Int. Cl.
*C08L 83/04* (2006.01)
*C08G 77/12* (2006.01)

(52) U.S. Cl.
CPC .............. *C08L 83/04* (2013.01); *C08G 77/12* (2013.01); *C08L 2205/025* (2013.01); *C08L 2205/03* (2013.01)

(58) Field of Classification Search
CPC .............. C08L 83/04; C08L 2205/025; C08L 2205/03; C08G 77/12
See application file for complete search history.

(56) References Cited

U.S. PATENT DOCUMENTS

| | | | | |
|---|---|---|---|---|
| 8,592,030 | B2 * | 11/2013 | Yamakawa | H01L 33/56 428/323 |
| 2010/0224906 | A1 | 9/2010 | Kashiwagi et al. | |
| 2015/0069456 | A1 | 3/2015 | Miyamoto et al. | |

FOREIGN PATENT DOCUMENTS

| | | |
|---|---|---|
| JP | 2008120844 A | 5/2008 |
| WO | 2013051600 A1 | 4/2013 |
| WO | 2014002918 A1 | 1/2014 |

OTHER PUBLICATIONS

English language abstract and machine-assisted English translation for JP 2008-120844 extracted from espacenet.com database on Jan. 21, 2021, 10 pages.
English language abstract and machine-assisted English translation for WO 2013/051600 extracted from espacenet.com database on Jan. 21, 2021, 50 pages.

* cited by examiner

*Primary Examiner* — James C Goloboy
(74) *Attorney, Agent, or Firm* — Howard & Howard Attorneys PLLC

(57) ABSTRACT

A white curable silicone composition provides excellent elongation characteristics while providing sufficiently great hardness, which as a result can provide a cured product having excellent toughness.
The composition comprises: (A) alkenyl group-containing resinous organopolysiloxane which is represented by an average composition formula: $(R^1_3SiO_{1/2})_a(R^1_2SiO_{2/2})_b(R^1SiO_{3/2})_c(SiO_{4/2})_d(XO_{1/2})_e$, where, in the formula, $R^1$ are each independently a monovalent hydrocarbon group, while at least two $R^1$ are alkenyl groups, X is a hydrogen atom or an alkyl group, $0 \leq a \leq 0.7$, $0 \leq b \leq 0.2$, $0 \leq c \leq 0.3$, $0 \leq d \leq 0.8$, and $0 \leq e \leq 0.2$, $a+b+c+d=1.0$, and $c+d>0$ are satisfied; (B) linear alkenyl group-containing organopolysiloxane which is represented by $R^2R^3_2SiO(R^3_2SiO)_nSiOR^2R^3_2$, where, in the formula, $R^2$ is an alkenyl group, $R^3$ are each independently a monovalent hydrocarbon group other than an alkenyl group, and n is an integer of 50 or greater; (C) organohydrogenpolysiloxane having at least two hydrogen atom-bonded silicon atoms in one molecule; (D) a catalyst for curing reaction; and (E) a white pigment, wherein the component (A) is included in an amount of 20 mass % or more based on the total mass of the organopolysiloxane components, and the alkenyl group content in the components (A) to (C) is 1.7 mass % or less.

17 Claims, No Drawings

CURABLE WHITE SILICONE FORMULATION, A REFLECTIVE MATERIAL FOR OPTICAL SEMICONDUCTOR MODULE, AND OPTICAL SEMICONDUCTOR DEVICE

CROSS REFERENCE TO RELATED APPLICATION

The present application claims priority to and all the benefits of Japanese Application No. 2019-235110 filed on Dec. 25, 2019, which is hereby expressly incorporated herein by reference in its entirety.

DESCRIPTION

Technical Filed

The present disclosure relates to a white curable silicone composition, more specifically, it relates to a white curable silicone composition which can be preferably used for a reflective material of optical semiconductor devices. The present disclosure also relates to a reflective material for optical semiconductor devices which comprises a cured product of said white curable silicone composition, and to an optical semiconductor device equipped with the reflective material.

Background Art

When curable silicone compositions are cured, they form cured products having excellent heat resistance, cold resistance, electrical insulation, weather resistance, water repellency, and transparency, and so they are used in a wide range of industrial fields. Compared to other organic materials, the cured products of this curable silicone composition are less prone to discolouration, with less change in their physical properties, thus making them suitable for optical materials.

For example, patent document 1 describes a curable resin composition for semiconductor packages, which is characterized by comprising, as essential components, (A) a silicon compound having a molecular weight of less than 1000 which has at least two carbon-carbon double bonds having reactivity with an SiH group in one molecule, (B) a compound having at least two SiH groups in one molecule, (C) a hydrosilylation catalyst, (D) a silicone compound having a molecular weight of 1000 or more, which has at least one carbon-carbon double bond having reactivity with an SiH group in one molecule, and (E) an inorganic filler.

In addition, patent document 2 describes a silicone adhesive composition for optical semiconductors, which is characterized by comprising 100 parts by weight of (A) polyorganosiloxane having two or more alkenyl groups bonded to a silicon atom in one molecule where the alkenyl group content is from 30 to 600 mmol/100 g, (B) polyorganohydrogensiloxane having three or more SiH groups in one molecule, in an amount that there are 1.0 to 5.0 SiH groups with respect to one silicon atom-bonded alkenyl group of component (A), a catalytic amount of (C) a platinum-based catalyst, 0.3 to 20 parts by weight of (D) an adhesiveness imparting agent, and 60 to 150 parts by weight of (E) titanium oxide having an average particle size of from 0.1 to 0.5 µm.

In recent years, there has been a demand for higher output density and thinner optical semiconductor devices such as light emitting diodes (LEDs). When a cured product of the conventional curable silicone composition is used in a reflective material of an optical semiconductor device, there has been a problem in that the toughness thereof may not be sufficient and cracks or chipping may form in the reflective material. In addition, when a white pigment such as titanium oxide is added in a large amount to the conventional curable silicone composition, there has been a problem in that the toughness of the cured product thereof deteriorates and cracks or chipping may form in the resulting reflective material.

PRIOR ART DOCUMENT

Patent Documents

[Patent Document 1] WO 2013/051600
[Patent document 2] Japanese Unexamined Patent Publication No. 2008-120844

SUMMARY OF THE INVENTION

Problem to be Solved by the Invention

An objective of the present disclosure is to provide a white curable silicone composition that provides excellent elongation characteristics while providing sufficiently great hardness, which as a result can form a cured product having excellent toughness.

Another objective of the present disclosure is to provide a reflective material for optical semiconductor devices that has excellent toughness. Yet another objective of the present disclosure is to provide an optical semiconductor device that is equipped with the reflective material for optical semiconductor devices of the present disclosure.

Means for Solving the Problems

In order to solve the abovementioned problems, the present inventors carried out extensive studies and as a result, surprisingly, they have found out that a white curable silicone composition having excellent elongation characteristics while providing sufficiently great hardness, which as a result can provide a cured product having excellent toughness, can be provided by allowing organopolysiloxane, namely a starting material, to include organopolysiloxane in which both ends of the molecular chain are capped with alkenyl groups and by adjusting the alkenyl group content in the organopolysiloxane starting material to a predefined range, and they have arrived at the present disclosure.

Accordingly, the present disclosure relates to a white curable silicone composition comprising: (A) alkenyl group-containing resinous organopolysiloxane which is represented by an average composition formula: $(R^1_3SiO_{1/2})_a(R^1_2SiO_{2/2})_b(R^1SiO_{3/2})_c(SiO_{4/2})_d(XO_{1/2})_e$, where, in the formula, $R^1$ are each independently a monovalent hydrocarbon group, while at least two $R^1$ are alkenyl groups, X is a hydrogen atom or an alkyl group, $0 \le a \le 0.7$, $0 \le b \le 0.2$, $0 \le c \le 0.3$, $0 \le d \le 0.8$, and $0 \le e \le 0.2$, $a+b+c+d=1.0$, and $c+d>0$ are satisfied; (B) linear alkenyl group-containing organopolysiloxane which is represented by $R^2R^3_2SiO(R^3_2SiO)_nSiOR^2R^3_2$, where, in the formula, $R^2$ is an alkenyl group, $R^3$ are each independently a monovalent hydrocarbon group other than an alkenyl group, and n is an integer of 50 or greater; (C) organohydrogenpolysiloxane having at least two hydrogen atom-bonded silicon atoms in one molecule; (D) a catalyst for curing reaction; and (E) a white pigment, wherein the component (A) is included in an amount of 20 mass % or more based on the total mass of the organopolysiloxane components, and the alkenyl group content in the components (A) to (C) is 1.7 mass % or less.

The content of the component (B) is preferably 30 mass % or more based on the total mass of the organopolysiloxane components.

The white pigment (E) is preferably included in an amount of 30 parts by mass or more based on 100 parts by mass of the total of the organopolysiloxane components.

The content of the alkenyl group included in the component (A) is preferably 1 mol % or more.

In the average composition formula of the component (A), b and c are preferably 0.

The molecular weight (Mw) of the component (B) is preferably 6000 to 200000.

The component (B) is preferably included in an amount that is same as the component (A) or in an amount greater than the component (A).

The present disclosure also relates to a reflective material for optical semiconductor devices, comprising the cured product of the white curable silicone composition of the present disclosure.

The present disclosure furthermore relates to an optical semiconductor device that is equipped with the reflective material for an optical semiconductor device of the present disclosure.

Effects of the Invention

With the white curable silicone composition according to the present disclosure, a cured product having excellent elongation characteristics while providing sufficiently great hardness can be formed, and thus a cured product having excellent toughness can be formed. Consequently, cracks or chipping can be prevented from forming in the cured product even when a large amount of white pigment such as titanium oxide is added. In addition, according to the reflective material for optical semiconductor devices of the present disclosure, excellent toughness is exhibited and thus a highly reliable reflective material can be provided.

MODE FOR CARRYING OUT THE INVENTION

White Curable Silicone Composition

The white curable silicone composition according to the present disclosure comprises: (A) alkenyl group-containing resinous organopolysiloxane which is represented by an average composition formula: $(R^1_3SiO_{1/2})_a(R^1_2SiO_{2/2})_b(R^1SiO_{3/2})_c(SiO_{4/2})_d(XO_{1/2})_e$, where, in the formula, $R^1$ are each independently a monovalent hydrocarbon group, while at least two $R^1$ are alkenyl groups, X is a hydrogen atom or an alkyl group, $0 \le a \le 0.7$, $0 \le b \le 0.2$, $0 \le c \le 0.3$, $0 \le d \le 0.8$, and $0 \le e \le 0.2$, $a+b+c+d=1.0$, and $c+d>0$ are satisfied; (B) linear alkenyl group-containing organopolysiloxane which is represented by $R^2R^3_2SiO(R^3_2SiO)_nSiOR^2R^3_2$, where, in the formula, $R^2$ is an alkenyl group, $R^3$ are each independently a monovalent hydrocarbon group other than an alkenyl group, and n is an integer of 50 or greater; (C) organohydrogensiloxane having at least two hydrogen atom-bonded silicon atoms in one molecule; (D) a catalyst for curing reaction; and (E) a white pigment, wherein the component (A) is included in an amount of 20 mass % or more based on the total mass of the organopolysiloxane components, and the alkenyl group content in the components (A) to (C) is 1.7 mass % or less.

The components of the white curable silicone composition of the present disclosure are described in detail below.

(A) Alkenyl Group-Containing Resinous Organopolysiloxane

The component (A) is a curable alkenyl group-containing resinous organopolysiloxane having at least two alkenyl groups in one molecule. The white curable silicone composition according to the present disclosure may comprise one type of the alkenyl group-containing resinous organopolysiloxane (A), or may comprise two or more types of the alkenyl group-containing resinous organopolysiloxane (A).

In the present specification, resinous organopolysiloxane refers to organopolysiloxane that has a branched structure or a 3D network structure in the molecular structure. According to an embodiment, the alkenyl group-containing resinous organopolysiloxane of component (A) contains at least one siloxane unit (T unit) represented by $RSiO_{3/2}$ and/or siloxane unit (Q unit) represented by $SiO_{4/2}$ in the molecular structure thereof. According to an embodiment, the alkenyl group-containing resinous organopolysiloxane of component (A) contains a Q unit, but not a T unit, in the molecular structure thereof.

The component (A) is represented by an average composition formula: $(R^1_3SiO_{1/2})_a(R^1_2SiO_{2/2})_b(R^1SiO_{3/2})_c(SiO_{4/2})_d(XO_{1/2})_e$, where, in the formula, $R^1$ are each independently a monovalent hydrocarbon group, while at least two $R^1$ are alkenyl groups, X is a hydrogen atom or an alkyl group, $0 \le a \le 0.6$, $0 \le b \le 0.2$, $0 \le c \le 0.3$, $0 \le d \le 0.7$, and $0 \le e \le 0.2$, $a+b+c+d=1.0$, and $c+d>0$ are satisfied.

In the average composition formula of the component (A), examples of the monovalent hydrocarbon group of $R^1$ include: $C_{1-12}$ alkyl groups such as a methyl group, an ethyl group, a propyl group, an isopropyl group, a butyl group, an isobutyl group, a tert-butyl group, a pentyl group, a neopentyl group, a hexyl group, a cyclohexyl group, a heptyl group, an octyl group, a nonyl group, a decyl group, an undecyl group, and a dodecyl group; $C_{6-20}$ aryl groups such as a phenyl group, a tolyl group, a xylyl group, and a naphthyl group; $C_{7-20}$ aralkyl groups such as a benzyl group, a phenethyl group, and a phenylpropyl group; $C_{2-12}$ alkenyl groups such as a vinyl group, an allyl group, a butenyl group, a pentenyl group, a hexenyl group, a heptenyl group, an octenyl group, a nonenyl group, a decenyl group, an undecenyl group, and a dodecenyl group; and any of these groups in which some or all of the hydrogen atoms are substituted with halogen atoms such as fluorine, chlorine, and bromine atoms. $R^1$ is preferably a monovalent hydrocarbon group having 1 to 6 carbon atoms, more preferably an alkyl group having 1 to 6 carbon atoms, particularly preferably a methyl group. In addition, according to an embodiment, $R^1$ is a monovalent hydrocarbon group other than a phenyl group. In addition, according to another embodiment, $R^1$ is a monovalent hydrocarbon group other than an aryl group.

In the average composition formula of component (A), at least two $R^1$ are alkenyl groups. Examples of the alkenyl groups include alkenyl groups having 2 to 12 carbon atoms such as a vinyl group, an allyl group, a butenyl group, a pentenyl group, a hexenyl group, a heptenyl group, an octenyl group, a nonenyl group, a decenyl group, an undecenyl group, and a dodecenyl group, and alkenyl groups having 2 to 6 carbon atoms are preferable, and a vinyl group is particularly preferable.

X in the average composition formula of the component (A) is a hydrogen atom or an alkyl group. Preferred examples of alkyl groups represented by X include $C_{1-3}$ alkyl groups, specifically, methyl, ethyl, and propyl groups.

In the average composition formula of the component (A), a is preferably in the range of $0.1 \le a \le 0.6$, more preferably in the range of $0.2 \le a \le 0.55$, and even more preferably in the range of 0.3≤a≤0.5. In the average composition formula of the component (A), b is preferably in the range of 0≤b≤0.15, more preferably in the range of 0≤b≤0.1, and particularly preferably in the range of 0≤b≤0.05. In the average composition formula of the component (A), cis preferably in the range of 0≤c≤0.2, more preferably in the range of 0≤c≤0.1, particularly preferably in the range of 0≤c≤0.05. In the average composition formula of the component (A), d is preferably in the range of 0.1≤d≤0.7, more preferably in the range of 0.2≤d≤0.65, even more preferably in the range of 0.3≤d≤0.6. In average unit formula (A-1), e is preferably in the range of 0≤e≤0.15, more preferably in the range of 0≤e≤0.1, and particularly preferably in the range of 0≤e≤0.05.

The alkenyl group content in the component (A) (mol % of alkenyl groups occupied in all silicon atom-bonded functional groups of the resinous organopolysiloxane) can be designed as appropriate, but is 1 mol % or more, preferably 2 mol % or more, more preferably 2.5 mol % or more, and even more preferably 3 mol % or more, and 8 mol % or less, preferably 6 mol % or less, more preferably 5 mol % or less, and preferentially 4 mol % or less. The alkenyl group content (mol %) can be determined by analysis such as Fourier transform infrared spectrophotometry (FT-IR) or nuclear magnetic resonance (NMR).

The alkenyl group content (mass %) included in the component (A) is not particularly limited, but is 0.1 mass % or more, preferably 0.5 mass % or more, more preferably 1 mass % or more, even more preferably 1.2 mass % or more, and 8 mass % or less, preferably 6 mass % or less, more preferably 4 mass % or less, preferentially 2 mass % or less. The alkenyl group content (mass %) can be, for example, calculated in terms of mass % of the vinyl groups when all alkenyl groups are substituted by vinyl groups provided that the total mass of the component (A) is 100, or can be determined by means of titration technique described later.

The component (A) preferably comprises M unit and Q unit, namely siloxane units represented by $R^3SiO_2$, and more preferably comprises M unit and Q unit only. That is, in the average composition formula of the component (A), b and c are 0. The ratio of M unit and Q unit is not particularly limited, but the molar ratio of M unit to Q unit is preferably in the range of 0.5 to 3, more preferably in the range of 0.8 to 2, even more preferably in the range of 1 to 1.5. According to an embodiment, the component (A) comprises more Q units than M units.

The component (A) is included in an amount of preferably 20 mass % or more based on the total mass of the organopolysiloxane components. The component (A) is included in an amount of preferably 25 mass % or more, more preferably 30 mass % or more, based on the total mass of the organopolysiloxane components. According to a preferred embodiment, the component (A) is included in an amount of 70 mass % or less, preferably 60 mass % or less, more preferably 55 mass % or less, particularly preferably 50 mass % or less, based on the total mass of the organopolysiloxane components.

(B) Linear Alkenyl Group-Containing Organopolysiloxane

The white curable silicone composition of the present disclosure includes, as component (B), a linear alkenyl group-containing organopolysiloxane which is represented by $R^2R^3{}_2SiO(R^3{}_2SiO)_nSiOR^2R^3{}_2$, (in the formula, $R^2$ is an alkenyl group, $R^3$ are each independently a monovalent hydrocarbon group other than an alkenyl group, and n is an integer of 50 or greater), which has a structure in which both ends of the molecular chain are capped with alkenyl groups.

As the component (B), only one type of the linear alkenyl group-containing organopolysiloxane may be used or two or more types of the linear alkenyl group-containing organopolysiloxane may be used in combination.

In the structural formula of component (B), $R^2$ is an alkenyl group. Examples of the alkenyl group include alkenyl groups having 2 to 12 carbon atoms such as a vinyl group, an allyl group, a butenyl group, a pentenyl group, a hexenyl group, a heptenyl group, an octenyl group, a nonenyl group, a decenyl group, an undecenyl group, and a dodecenyl group, and alkenyl groups having 2 to 6 carbon atoms are preferable, and a vinyl group is particularly preferable.

In the structural formula of component (B), $R^3$ is a monovalent hydrocarbon group other than an alkenyl group. Examples of $R^3$ include $C_{1-2}$ alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; $C_{6-20}$ aryl groups such as phenyl, tolyl, xylyl, and naphthyl groups; $C_{7-20}$ aralkyl groups such as benzyl, phenethyl, and phenylpropyl groups; and any of these groups in which some or all of the hydrogen atoms are substituted with halogen atoms such as fluorine, chlorine, and bromine atoms. $R^3$ is preferably a monovalent hydrocarbon group having 1 to 6 carbon atoms other than an alkenyl group, more preferably an alkyl group having 1 to 6 carbon atoms, particularly preferably a methyl group. In addition, according to an embodiment, $R^3$ is a monovalent hydrocarbon group other than a phenyl group. In addition, in another embodiment, $R^3$ is a monovalent hydrocarbon group other than an aryl group.

In the structural formula of component (B), n is 50 or greater, preferably 100 or greater, more preferably 150 or greater, even more preferably 200 or greater, particularly preferably 250 or greater. According to an embodiment, n is 3000 or smaller, more preferably 2000 or smaller.

The molecular weight (Mw) of component (B) is not particularly limited, but is preferably 6000 or more, more preferably 10000 or more, even more preferably 14000 or more, preferentially 18000 or more. According to an embodiment, the molecular weight (Mw) of component (B) is 200000 or less, preferably 160000 or less, more preferably 120000 or less. Herein, the weight average molecular weight (Mw) can be determined in terms of standard polystyrene by means of GPC.

The alkenyl group content (mass %) in the component (B) is not particularly limited, but is 0.01 mass % or more, preferably 0.03 mass % or more, more preferably 0.05 mass % or more, even more preferably 0.07 mass % or more, and 2 mass % or less, preferably 1.5 mass % or less, more preferably 1 mass % or less, preferentially 0.6 mass % or less. The alkenyl group content (mass %) can be, for example, calculated in terms of mass % of the vinyl groups when all alkenyl groups are substituted by vinyl groups provided that the total mass of the component (B) is 100, or can be determined by means of titration technique described later.

The content of component (B) is not particularly limited, but is preferably 20 mass % or more, more preferably 30 mass % or more, even more preferably 35 mass % or more, preferentially 40 mass % or more, particularly preferably 45 mass % or more, based on the total mass of the organopolysiloxane components. According to a preferred embodiment, the component (B) is included in an amount of 80 mass % or less, preferably 75 mass % or less, more preferably 70 mass % or less, based on the total mass of the organopolysiloxane components.

According to an embodiment, the component (B) is included in an amount that is same as the component (A) or in an amount greater than the component (A) in the white curable silicone composition. In addition, according to another embodiment, the white curable silicone composition includes the component (B) in such a way that the mass ratio of component (B) to component (A) is in the range of 0.5 to 3, preferably in the range of 0.8 to 2.5, more preferably in the range of 0.9 to 2.2.

(C) Organohydrogenpolysiloxane

The white curable silicone composition of the present disclosure includes, as a crosslinking agent, organohydrogenpolysiloxane having at least two silicon atom-bonded hydrogen atoms in one molecule of component (C). One organohydrogenpolysiloxane or a combination of 2 or more organohydrogenpolysiloxanes may be used as component (C).

Examples of the molecular structure of component (C) are linear, linear with some branching, branched, cyclic, and 3D network structures, and linear structures are preferable. An organohydrogenpolysiloxane having only one type of structure may be used, or organohydrogenpolysiloxanes having two or more types of structures may be used in combination as component (C).

The silicon atom-bonded hydrogen atoms of component (C) may be included at both ends of the molecular chain or in side chains other than both ends of the molecular chain. Examples of a group that bonds to a silicon atom other than the hydrogen atom in component (C) include monovalent hydrocarbon groups, and specific examples include $C_{1-12}$ alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; $C_{6-20}$ aryl groups such as phenyl, tolyl, xylyl, and naphthyl groups; $C_{7-20}$ aralkyl groups such as benzyl, phenethyl, and phenylpropyl groups; and any of these groups in which some or all of the hydrogen atoms are substituted with halogen atoms such as fluorine, chlorine, and bromine atoms. The silicon atoms in component (C) may have a small quantity of hydroxyl groups or alkoxy groups such as methoxy or ethoxy groups, within the scope of not impairing the objectives of the present disclosure.

Examples of this kind of component (C) include: dimethylpolysiloxane in which dimethylhydrogensiloxy groups are capped at both ends of the molecular chain, dimethylsiloxane-methylphenylsiloxane copolymers in which dimethylhydrogensiloxy groups are capped at both ends of the molecular chain, dimethylsiloxane-methylhydrogensiloxane copolymers in which dimethylhydrogensiloxy groups are capped at both ends of the molecular chain, methylhydrogenpolysiloxane in which trimethylsiloxy groups are capped at both ends of the molecular chain, dimethylsiloxane-methylhydrogensiloxane copolymers in which trimethylsiloxy groups are capped at both ends of the molecular chain, organosiloxanes including $H(CH_3)_2SiO_{1/2}$ units and $SiO_{4/2}$ units, and organopolysiloxanes including $H(CH_3)_2SiO_{1/2}$ units, $(CH_3)_3SiO_{1/2}$ units, and $SiO_{4/2}$ units.

The content of component (C) is not particularly limited but can, for example, be an amount resulting in 0.1 to 10 mols, preferably 0.5 to 5 mols, and particularly 0.8 to 2.0 mols of silicon atom-bonded hydrogen atoms in the component per 1 mol of silicon atom-bonded alkenyl groups in the white curable silicone composition. The content of silicon atom-bonded hydrogen atoms in component (C) can be, for example, determined by analysis such as Fourier transform infrared spectrophotometry (FT-IR) or nuclear magnetic resonance (NMR).

According to another embodiment, the content of component (C) is in the range of 0.1 to 15 mass %, preferably in the range of 0.5 to 10 mass %, more preferably in the range of 1 to 6 mass %, with respect to the total mass of the organopolysiloxane components.

In the white curable silicone composition according to the present disclosure, the alkenyl content in components (A) to (C) is 1.7 mass % or less. The alkenyl group content in components (A) to (C) is more preferably 1.5 mass % or less, more preferably 1.3 mass % or less, preferentially 1.2 mass % or less, particularly preferably 1.1 mass % or less. According to an embodiment, the alkenyl content in components (A) to (C) is 0.1 mass % or more, preferably 0.3 mass % or more, more preferably 0.5 mass % or more. The alkenyl group content (mass %) can be, for example, calculated in terms of mass % of the vinyl groups when all alkenyl groups are substituted by vinyl groups provided that the total mass of the components (A) to (C) is 100, or can be determined by means of titration technique described below.

A method for determining the alkenyl group concentration in the components by the titration technique will be described. The alkenyl group content in components (A) to (C) can be accurately quantified by a titration method generally known as a Wijs method. The principle will be described below. Firstly, an alkenyl group in the silicone starting material and iodine monochloride are subjected to addition reaction as shown in formula (1). Next, according to the reaction shown in formula (2), an excess amount of iodine monochloride is reacted with potassium iodide, thereby freeing iodine. The freed iodine is subjected to titration with a sodium thiosulfate solution.

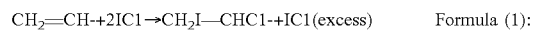
$CH_2=CH-+2ICl \rightarrow CH_2I-CHCl-+ICl(excess)$    Formula (1):

$ICl+KI \rightarrow I_2+KCl$    Formula (2):

The alkenyl group concentration (mol %) in the component can be quantified from the difference between the amount of sodium thiosulfate required for titration and the titration amount of the blank solution prepared separately. When determining the mass %, the mass % can be calculated by multiplying the molar % by the formula amount (in the case of a vinyl group, $CH_2=CH-$, so the formula amount is 27).

(D) Curing Catalyst

The white curable silicone composition according to the present disclosure includes a curing catalyst as component (D) which is for curing the organopolysiloxanes of components (A) to (C). The white curable silicone composition according to the present disclosure may comprise one type of the curing catalyst (D), and may contain two or more types of the curing catalyst (D).

The curing catalyst, namely component (D), is a hydrosilylation catalyst for accelerating the curing of hydrosilylation reaction-curable type silicone compositions. Examples of component (D) are platinum catalysts such as chloroplatinic acid, alcohol solution of chloroplatinic acid, platinum-olefin complex, platinum-1,3-divinyl-1,1,3,3-tetramethyldisiloxane complex, and platinum-supporting powder; palladium catalysts such as tetrakis(triphenylphosphine)palladium, and mixtures of triphenylphosphine and palladium black; and rhodium catalysts, and platinum catalysts are particularly preferable.

The blended amount of component (D) is a catalytic amount that is needed to cure components (A) to (C), and is not particularly limited, but when a platinum catalyst is used, for example, the amount of platinum metal contained in the platinum catalyst is preferably in the range of 0.01 to 1000 ppm for practical purposes, and is particularly preferably in the range of 0.1 to 500 ppm, by weight unit, in the silicone composition.

(E) White Pigment

The white curable silicone composition according to the present disclosure comprises a white pigment as component (E). The white pigment (E) may comprise one kind of white pigment (E), or may comprise two or more kinds of white pigment (E).

Examples of white pigments (E) include metal oxides such as titanium oxide, aluminium oxide, zinc oxide, zirconium oxide and magnesium oxide; hollow fillers such as glass balloons and glass beads; and others such as barium sulfate, zinc sulfate, barium titanate, aluminium nitride, boron nitride, and antimony oxide. Titanium oxide is preferred because of the high optical reflectance and concealing properties. Aluminium oxide, zinc oxide, and barium titanate are also preferred because of the high optical reflectance in the UV region.

The white pigment (E) may furthermore be surface-treated in order to increase the reflectance, whiteness, and light resistance. Examples of types of surface treatments include well-known surface treatments such as treatment with aluminium oxide, aluminium hydroxide, silica, zinc oxide, zirconium oxide, organic compounds, and siloxanes. The organic compounds are not particularly limited, and examples include polyhydric alcohols, alkanolamines or derivatives thereof, organosilicon compounds such as organic siloxanes, higher fatty acids or metal salts thereof, organometallic compounds, and the like. The method of surface treatment is not particularly limited and can be any known method, and examples of methods that can be used include (1) methods in which a white pigment that has already been surface treated is mixed into the silicone composition, (2) methods in which a surface treatment agent is added separately from the white pigment into the silicone composition and reacted with the white pigment in the composition, and the like.

The surface treatment of the white pigment (E) is not particularly limited and can be any known treatment, but silica-free treatments are particularly preferred because of the particularly exceptional light resistance of the white cured product that is obtained. Organic substance-free treatments are more particularly preferred because of the high reflectance that can be maintained following heat resistance tests of the white cured product that is obtained. The surface treatment of the white pigment can be analysed by using a method of analysis such as scanning electron microscopy with energy-dispersive X-ray analysis (SEM-EDX) or inductively coupled plasma mass spectrometry (ICP-MS).

The average particle size and configuration of component (E) are not particularly limited, but the average particle size is preferably in the range of 0.05 to 10 µm, and particularly preferably in the range of 0.1 to 2 µm. In the present specification, the average particle size means the 50% integrated value of the particle size distribution, as determined by laser diffraction/scattering.

In the present composition, the content of component (E) is not particularly limited, but is preferably 30 parts by mass or more with respect to 100 parts by mass of the total of the organopolysiloxane components. The content of component (E) is preferably 40 parts by mass or more, more preferably 45 parts by mass or more, with respect to 100 parts by mass of the total of the organopolysiloxane components. That is because a component (E) content at or over the above lower limit will result in a cured product that has good optical reflectance. In addition, according to a preferred embodiment, the component (E) is included in an amount of 80 parts by mass or less, preferably 70 parts by mass or less, more preferably 60 parts by mass or less, with respect to 100 parts by mass of the total of the organopolysiloxane components of the present composition.

Optional components can be blended into the white curable silicone composition of the present disclosure within the range of not impairing the objective of the present disclosure. Examples of optional components include acetylene compounds, organic phosphorus compounds, vinyl group-containing siloxane compounds, and hydrosilylation reaction inhibitors, curing retarder, inorganic fillers other than white pigments, or inorganic fillers that have undergone a surface hydrophobic treatment with an organosilicon compound, surface treatment agents of powder or surfactants, organopolysiloxanes free from silicon atom-bonded hydrogen atoms and silicon atom-bonded alkenyl groups, tackifiers, releasing agents, metallic soap, agents that impart heat resistance, agents that impart cold resistance, thermally conductive fillers, agents that impart flame retardance, agents that impart thixotropic properties, fluorescent substances, solvents, and the like.

Hydrosilylation inhibitor is a component for suppressing the hydrosilylation of the silicone composition, and specific examples are acetylene-based reaction inhibitors such as ethynylcyclohexanol, and reaction inhibitors based on amine, carboxylic acid ester, phosphite ester, etc. The reaction inhibitor is usually added in an amount of 0.001 to 5% by mass of the total composition of the present disclosure.

Examples of the curing retarder include: alkyne alcohols such as 2-methyl-3-butyn-2-ol, 3,5-dimethyl-1-hexyn-3-ol, 2-phenyl-3-butyn-2-ol, 1-ethynyl-1-cyclohexanol; enyne compounds such as 3-methyl-3-penten-1-yne and 3,5-dimethyl-3-hexen-1-yne; alkenyl group-containing low-molecular weight siloxanes such as tetramethyltetravinylcyclotetrasiloxane and tetramethyltetrahexenylcyclotetrasiloxane; and alkynyloxysilanes such as methyl-tris(1,1-dimethylpropynyloxy) silane and vinyl-tris(1,1-dimethylpropynyloxy) silane. The content of the curing retarder is not limited but is preferably in the range of 10 to 10000 ppm in terms of mass units, with respect to the present composition.

Examples of inorganic fillers include: metal oxide particles such as fumed silica, crystalline silica, precipitated silica, silsesquioxane, magnesium oxide, iron oxide, talc, mica, diatomous earth and glass beads; inorganic fillers such as aluminium hydroxide, magnesium carbonate, calcium carbonate and zinc carbonate; fibrous fillers such as glass fibre; and fillers such as these fillers that have undergone a surface hydrophobic treatment with an organosilicon compound such as an organoalkoxysilane compound, an organochlorosilane compound, an organosilazane compound, or a low molecular weight siloxane compound. Silicone rubber powder, silicone resin powder and the like can also be incorporated. The inorganic filler may be blended in an amount of 40% by mass or less, preferably 30% by mass or less, more preferably 20% by mass or less, and particularly 10% by mass or less, of the composition.

The surface treatment agent of powder is not particularly limited, and examples include organosilazans, organocyclosiloxanes, organochlorosilanes, organoalkoxysilanes, low molecular weight linear siloxanes, organic compounds and the like. Herein, examples of the organic compound include plyhydric alcohols, alkanolamines or derivatives thereof, organic silicon compounds such as organic siloxane, higher fatty acids or metal salts thereof, organic metal complexes, organometallic complexes, fluorine-based organic compounds, anionic surfactants, cationic surfactants, nonionic surfactants, and the like.

The adhesiveness imparting agent is preferably an organic silicon compound having at least one alkoxy group bonded to a silicon atom in one molecule. Examples of the alkoxy group include a methoxy group, an ethoxy group, a propoxy group, a butoxy group and a methoxy group, and a methoxy group is particularly preferable. Examples of a group that bonds to the silicon atom other than the alkoxy group in the organic silicon compound include: a halogen-substituted or non-substituted monovalent hydrocarbon group such as an alkyl group, an alkenyl group, an aryl group, an aralkyl group and alkyl halide groups; a glycidoxyalkyl group such as a 3-glycidoxypropyl group and a 4-glycidoxybutyl group; an epoxycylohexyalalkyl group such as a 2-(3,4-epoxycylohexyl)ethyl group and a 3-(3,4-epoxycyclohexyl)propyl group; an epoxyalkyl group such as a 3,4-epoxybutyl group and a 7,8-epoxyoctyl group; an acryl group-containing monovalent organic group such as a 3-methacryloxypropyl group; and a hydrogen atom. The organic silicon compound preferably has a group that undergoes reaction with an alkenyl group or a silicon atom-bonded hydrogen atom in the present composition, and specifically, the compound preferably has a silicon atom-bonded hydrogen atom or an alkenyl group. In addition, in view of imparting excellent adhesiveness to various base materials, this organic silicon compound preferably has at least one epoxy group-containing monovalent organic group in one molecule. Examples of the organic silicon compound include an organosilane compound, an organosiloxane oligomer, and an alkyl silicate. The molecular structure of the organosiloxane oligomer or alkyl silicate may be, for example, linear, linear with some branching, branched, cyclic or network structure, and in particular, linear, branched and network structures are preferable. Examples of the organic silicon compound include: a silane compound such as 3-glycidoxypropyltrimethoxysilane, 2-(3,4-epoxycyclohexyl)ethyltrimethoxysilane, and 3-methacryloxypropyltrimethoxysilane; a siloxane compound having, in one molecule, at least one silicon atom-bonded alkenyl group or silicon atom-bonded hydrogen atom, as well as a silicon atom-bonded alkoxy group; a mixture of a silane compound or siloxane compound which has at least one silicon atom-bonded alkoxy group and a siloxane compound having, in one molecule, at least one silicon atom-bonded hydroxy group and silicon atom-bonded alkenyl group; methyl polysilicate; ethyl polysilicate; and epoxy group-containing ethyl polysilicate. The adhesiveness imparting agent is preferably a low-viscosity solution, and the viscosity thereof is not limited but is preferably in the range of 1 to 500 mPa·s at 25° C. In addition, the content of the adhesiveness imparting agent is not limited, but is preferably in the range of from 0.01 to 10 parts by mass with respect to 100 parts by mass of the total of the present composition.

The releasing agent is not particularly limited, and examples include a carboxylic acid-based releasing agent, an ester-based releasing agent, an ether-based releasing agent, a ketone-based releasing agent, an alcohol-based releasing agent, and the like. These may be used singly or may be used in combination of two or more kinds. In addition, as the releasing agent, a substance free from a silicon atom, a substance including a silicon atom or a mixture thereof can be used. Specific examples of the releasing agent include carnauba wax, montan wax, calcium stearate, calcium montanate, magnesium stearate, magnesium montanate, zinc stearate, zinc montanate, ester-based wax, olefin-based wax, and the like.

The white curable silicone composition of the present disclosure can be prepared by mixing the components. The method of mixing the components may be a conventionally known method, and is not particularly limited, and a uniform mixture is usually obtained by simple mixing. When solid components such as inorganic filler are included as an optional component, it is preferable to use a mixing device for the mixing. There are no particular limitations regarding this mixing device, and examples include single- and twin-screw continuous mixers, double roller mixers, Ross mixers, Hobart mixers, dental mixers, planetary mixers, kneader mixers, Henschel mixers, and the like.

A cured product obtained by curing the white curable silicone composition of the present disclosure can exhibit sufficiently great hardness. For example, a cured product obtained by heating the white curable silicone composition of the present disclosure at 150° C. for 2 hours can be measured by means of a type D durometer specified in JIS K 7215-1986 "Plastic Durometer Hardness Test Method", and can show preferably a hardness of 10 or more, more preferably a hardness of 12 or more.

A cured product obtained by curing the white curable silicone composition of the present disclosure can exhibit excellent elongation characteristics. For example, the white curable silicone composition of the present disclosure is heated at 150° C. for 2 hours, thereby preparing a cured product in a sheet form which has a thickness of 1 mm, and this is punched into a shape of dumbbell-shaped No. 3 specified in JIS K 6251-1993 "Tensile test method for vulcanized rubber", and this sample is used to measure the elongation (%) at break, and the sample preferably shows an elongation of 52(%) or more, more preferably shows an elongation of 55(%) or more.

The cured product obtained by curing the white curable silicone composition of the present disclosure exhibits excellent elongation characteristics while still exhibiting sufficiently high hardness, and thus has excellent toughness. The white curable silicone composition of the present disclosure can therefore be suitably used for an optical reflective material, in particular, an optical reflective material for optical semiconductor devices which require higher output density and thinner size.

Reflective Material for Optical Semiconductor Devices

The present disclosure also relates to a reflective material for optical semiconductor devices, that can be obtained by curing the white curable silicone composition of the present disclosure. The reflective material for optical semiconductor devices of the present disclosure can be obtained by curing the white curable silicone composition of the present disclosure, and thus has excellent toughness. The optical semiconductor device is not particularly limited, and examples include light emitting diodes (LED), semiconductor lasers, photodiodes, phototransistors, solid-state imaging, and light emitters and light receivers for photocouplers, and in particular, light emitting diodes (LED) are preferable.

Optical Semiconductor Device

The optical semiconductor device of the present disclosure is equipped with the reflective material for optical semiconductor devices of the present disclosure. Examples of such optical semiconductor devices include light emitting diodes (LED), semiconductor lasers, photodiodes, phototransistors, solid-state imaging, and light emitters and light receivers for photocouplers, and in particular, light emitting diodes (LED) are preferable. The optical semiconductor device of the present disclosure is equipped with the reflective material for optical semiconductor devices of the present disclosure, which has excellent toughness, and thus the optical semiconductor device has remarkable reliability.

EXAMPLES

The white curable silicone composition of the present disclosure is described in greater detail by means of the following examples and comparative examples.

The starting material components shown below were used in the following examples and comparative examples. Below, Me represents a methyl group and Vi represents a vinyl group. In the examples, the vinyl group content (mol %) in the total of the silicon atom-bonded functional groups is a value calculated from the structural formula, and the vinyl group content (mass %) is a value determined by means of the titration technique mentioned above.

Component a-1: Alkenyl group-containing resinous organopolysiloxane represented by an average composition formula of $(ViMe_2SiO_{1/2})_{0.04}(Me_3SiO_{1/2})_{0.40}(SiO_{4/2})_{0.56}$; vinyl group content in the total of silicon atom-bonded functional groups of 3.03 mol %; vinyl group content of 1.55 mass %

Component a-2: Alkenyl group-containing resinous organopolysiloxane represented by an average composition formula of $(ViMe_2SiO_{1/2})_{0.15}(Me_3SiO_{1/2})_{0.45}(SiO_{4/2})_{0.40}$; vinyl group content in the total of silicon atom-bonded functional groups of 8.33 mol %; vinyl group content of 5.44 mass %

Component a-3: Alkenyl group-containing resinous organopolysiloxane represented by an average composition formula of $(ViMe_2SiO_{1/2})_{0.10}(Me_3SiO_{1/2})_{0.40}(SiO_{4/2})_{0.50}$; vinyl group content in the total of silicon atom-bonded functional groups of 6.67 mol %; vinyl group content of 3.40 mass %

Component a-4: Resinous organopolysiloxane represented by an average composition formula of $(Me_3SiO_{1/2})_{0.44}(SiO_{4/2})_{0.56}$ Component b-1: Linear organopolysiloxane in which both ends of the molecular chain are capped with vinyl groups, which is represented by a general formula of $ViMe_2SiO(Me_2SiO)_nSiMe_2Vi$; molecular weight (Mw) of 99000; vinyl group content of 0.089 mass %

Component b-2: Linear organopolysiloxane in which both ends of the molecular chain are capped with vinyl groups, which is represented by a general formula of $ViMe_2SiO(Me_2SiO)_nSiMe_2Vi$; molecular weight (Mw) of 21000; vinyl group content of 0.45 mass %

Component b-3: Linear organopolysiloxane having a vinyl group on the side chain of the molecular chain, which is represented by a unit formula of $Me_3SiO(ViMeSiO)_n(Me_2SiO)_mSiMe_3$; molecular weight (Mw) of 98000; vinyl group content of 0.48 mass %

Component b-4: Linear organopolysiloxane having vinyl groups in both of the end and side chain of the molecular chain, which is represented by a general formula of $ViMe_2SiO(ViMeSiO)_n(Me_2SiO)_mSiMe_2Vi$; molecular weight (Mw) of 90000; vinyl group content of 7.5 mass %

Component c: organohydrogenpolysiloxane represented by general formula of $Me_3SiO(HMeSiO)_{50}SiMe_3$ Component d: Complex of platinum having a platinum concentration of 4.0 mass % and 1,3-divinyl-1,1,3,3-tetramethyldisiloxane Component e: Titanium oxide (average particle size of 0.25 µm, PX3788, manufactured by Sakai Chemical Industry Co. Ltd.)

Examples 1-3 and Comparative Examples 1-6

White curable silicone compositions were prepared by mixing the components in accordance with the formulations (% by mass) shown in Tables 1 and 2. Herein, "Vi content" in Tables 1 and 2 represent the mass % of the vinyl groups included in components a to c with respect to the total mass of components a to c.

Evaluation

With regard to the respective compositions of the examples and comparative examples, the hardness and elongation of cured products were measured as below and the results are shown in Tables 1 and 2.

Hardness of Cured Product

A white curable silicone composition was heated at 150° C. for 2 hours in order to prepare a cured product having a thickness of 10 mm. The hardness of the cured product was measured by means of a type D durometer specified in JIS K 7215-1986 "Plastic Durometer Hardness Test Method".

Elongation of Cured Product

The white curable silicone composition was applied in a sheet form and heated at 150° C. for 2 hours, thereby preparing a cured product in a sheet form which has a thickness of 1 mm, and this was punched into a shape of dumbbell-shaped No. 3 specified in JIS K 6251-1993 "Tensile test method for vulcanized rubber", and this sample was used to measure the elongation (%) at break by using Autograph manufactured by Shimadzu Corporation.

TABLE 1

| Component | Example 1 | Example 2 | Example 3 |
|---|---|---|---|
| a-1 | 47.7 | 48.3 | 32.4 |
| b-1 | 47.7 | — | — |
| b-2 | — | 48.3 | 64.8 |
| c | 4.6 | 3.4 | 2.8 |
| Total | 100 | 100 | 100 |
| Vi content (mass %) | 0.78% | 0.97% | 0.79% |
| e | 50 | 50 | 50 |
| d | Amount of catalyst | Amount of catalyst | Amount of catalyst |
| Evaluation | | | |
| Hardness | 29 | 33 | 14 |
| Elongation (%) | 198 | 58 | 91 |

TABLE 2

| Component | Comparative Example 1 | Comparative Example 2 | Comparative Example 3 | Comparative Example 4 | Comparative Example 5 | Comparative Example 6 |
|---|---|---|---|---|---|---|
| a-1 | — | — | — | — | — | 32.3 |
| a-2 | 48.3 | — | 31.4 | — | — | — |
| a-3 | — | — | — | 62.5 | — | — |
| a-4 | — | — | — | — | 49.8 | — |
| b-1 | — | — | — | — | 49.8 | — |
| b-2 | — | — | 62.7 | 31.2 | — | — |

TABLE 2-continued

| Component | Comparative Example 1 | Comparative Example 2 | Comparative Example 3 | Comparative Example 4 | Comparative Example 5 | Comparative Example 6 |
|---|---|---|---|---|---|---|
| b-3 | 48.3 | — | — | — | — | 64.7 |
| b-4 | | 79 | | | | |
| c | 3.4 | 21 | 5.9 | 6.3 | 0.5 | 3.0 |
| Total | 100 | 100 | 100 | 100 | 100 | 100 |
| Vi content (mass%) | 2.86% | 5.93% | 1.99% | 2.27% | 0.04% | 0.81% |
| e | 50 | 50 | 50 | 50 | 50 | 50 |
| d | Amount of catalyst | Amount of catalyst | Amount of catalyst | Amount of catalyst | Amount of catalyst | Amount of catalyst |
| Evaluation | | | | | | |
| Hardness | 18 | 67 | 20 | 42 | Not measurable (did not fully cure) | 19 |
| Elongation (%) | 13 | 1 | 51 | 11 | Not measurable (did not fully cure) | 30 |

As is clear from the abovementioned results, the cured products formed from the white curable silicone compositions of examples 1 to 3 of the present disclosure showed, while still maintaining a hardness of 10 or greater, a high elongation ratio of 55% or more, and had excellent toughness.

INDUSTRIAL APPLICABILITY

The white curable silicone composition of the present disclosure is useful as a reflective material for optical semiconductor devices, particularly as a reflective material for optical semiconductor devices such as light emitting diodes (LEDs), semiconductor lasers, photodiodes, phototransistors, solid-state imaging, and light emitters and light receivers for photocouplers, etc.

The invention claimed is:

1. A white curable silicone composition comprising: (A) alkenyl group-containing resinous organopolysiloxane which is represented by an average composition formula: $(R^1_3SiO_{1/2})_a(R^1_2SiO_{2/2})_b(R^1SiO_{3/2})_c(SiO_{4/2})_d(XO_{1/2})_e$, where, in the formula, $R^1$ are each independently a monovalent hydrocarbon group, while at least two $R^1$ are alkenyl groups, X is a hydrogen atom or an alkyl group, $0 \le a \le 0.7$, $0 \le b \le 0.2$, $0 \le c \le 0.3$, $0 \le d \le 0.8$, and $0 \le e \le 0.2$, $a+b+c+d=1.0$, and $c+d>0$ are satisfied; (B) linear alkenyl group-containing organopolysiloxane which is represented by $R^2R^3_2SiO(R^3_2SiO)_nSiOR^2R^3_2$, where, in the formula, $R^2$ is an alkenyl group, $R^3$ are each independently a monovalent hydrocarbon group other than an alkenyl group, and n is an integer of 50 or greater; (C) organohydrogenpolysiloxane having at least two hydrogen atom-bonded silicon atoms in one molecule; (D) a catalyst for curing reaction; and (E) a white pigment, wherein the component (A) is included in an amount of 20 mass % or more based on the total mass of the organopolysiloxane components, the component (B) is included in an amount that is same as the component (A) or in an amount greater than the component (A), and the alkenyl group content in the components (A) to (C) is 1.7 mass % or less.

2. A white curable silicone composition according to claim 1, wherein the content of the component (B) is 30 mass % or more based on the total mass of the organopolysiloxane components.

3. A white curable silicone composition according to claim 1, wherein the white pigment (E) is included in an amount of 30 parts by mass or more based on 100 parts by mass of the total of the organopolysiloxane components.

4. A white curable silicone composition according to claim 1, wherein the content of the alkenyl group included in the component (A) is 1 mol % or more.

5. A white curable silicone composition according to claim 1, wherein, in the average composition formula of the component (A), b and c are 0.

6. A white curable silicone composition according to claim 1, wherein the molecular weight (Mw) of the component (B) is 6000 to 200000.

7. A reflective material for optical semiconductor devices, comprising a cured product of the white curable silicone composition according to claim 1.

8. An optical semiconductor device, comprising the reflective material for optical semiconductor devices according to claim 7.

9. A white curable silicone composition according to claim 2, wherein the white pigment (E) is included in an amount of 30 parts by mass or more based on 100 parts by mass of the total of the organopolysiloxane components.

10. A white curable silicone composition according to claim 2, wherein the content of the alkenyl group included in the component (A) is 1 mol % or more.

11. A white curable silicone composition according to claim 3, wherein the content of the alkenyl group included in the component (A) is 1 mol % or more.

12. A white curable silicone composition according to claim 9, wherein the content of the alkenyl group included in the component (A) is 1 mol % or more.

13. A white curable silicone composition according to claim 2, wherein, in the average composition formula of the component (A), b and c are 0.

14. A white curable silicone composition according to claim 3, wherein, in the average composition formula of the component (A), b and c are 0.

15. A white curable silicone composition according to claim 4, wherein, in the average composition formula of the component (A), b and c are 0.

16. A white curable silicone composition according to claim 9, wherein, in the average composition formula of the component (A), b and c are 0.

17. A white curable silicone composition according to claim 12, wherein, in the average composition formula of the component (A), b and c are 0.

* * * * *